(12) United States Patent
Laird et al.

(10) Patent No.: US 9,910,075 B2
(45) Date of Patent: Mar. 6, 2018

(54) OVERVOLTAGE DETECTION CIRCUIT FOR DETECTING AN OVERVOLTAGE SPIKE FROM AN EXTERNAL POWER SUPPLY

(71) Applicant: Western Digital Technologies, Inc., Irvine, CA (US)

(72) Inventors: William K. Laird, Corona, CA (US); Joseph J. Crowfoot, Irvine, CA (US)

(73) Assignee: Western Digital Technologies, Inc., Irvine, CA (US)

( * ) Notice: Subject to any disclaimer, the term of this patent is extended or adjusted under 35 U.S.C. 154(b) by 138 days.

(21) Appl. No.: 15/095,605

(22) Filed: Apr. 11, 2016

(65) Prior Publication Data

US 2017/0292979 A1 Oct. 12, 2017

(51) Int. Cl.
| | | |
|---|---|---|
| *G01R 13/04* | (2006.01) | |
| *G01R 19/165* | (2006.01) | |
| *G11C 5/14* | (2006.01) | |
| *G11C 16/30* | (2006.01) | |
| *G11B 33/10* | (2006.01) | |
| *G01R 15/14* | (2006.01) | |
| *G01R 15/12* | (2006.01) | |
| *G01R 13/16* | (2006.01) | |
| *G01R 19/00* | (2006.01) | |
| *G01R 31/28* | (2006.01) | |

(52) U.S. Cl.
CPC ....... *G01R 19/16528* (2013.01); *G01R 13/16* (2013.01); *G01R 15/12* (2013.01); *G01R 15/144* (2013.01); *G11B 33/10* (2013.01); *G11C 5/143* (2013.01); *G11C 16/30* (2013.01); *G01R 19/00* (2013.01); *G01R 31/2829* (2013.01)

(58) Field of Classification Search
CPC .... G01R 13/16; G01R 31/2829; G01R 15/12; G01R 15/144; G01R 19/00; G01R 19/30; G01R 21/06; G01R 31/261; G01R 31/2623
USPC ..... 324/72, 76.11–76.83, 113; 713/300, 310, 713/320–324, 330, 340; 714/1, 2, 6.1, 714/15, 22, 100, 746, 763
See application file for complete search history.

(56) References Cited

U.S. PATENT DOCUMENTS 5,946,175 A 8/1999 Yu
6,014,305 A 1/2000 Yu
(Continued)

*Primary Examiner* — Jermele M Hollington
*Assistant Examiner* — Paul Rios Russo
(74) *Attorney, Agent, or Firm* — Foley & Lardner LLP

(57) ABSTRACT

An overvoltage detection circuit coupled to an external power supply via a voltage supply line and comprising a transistor comprising first terminal coupled to the voltage supply line, second terminal coupled to the first terminal via a resistor, the second terminal coupled to a parasitic capacitor, the transistor configured to receive an overvoltage spike from the external power supply on the first terminal, and provide an output voltage on third terminal of the transistor to indicate detection of the overvoltage spike when it has a duration less than a time constant based on the resistor and the parasitic capacitor and amplitude that exceeds a threshold voltage of the transistor. The overvoltage detection circuit further comprises a monitor circuit configured to receive the output voltage from the transistor and provide a digital signal providing a notification of the detected overvoltage spike from the external power supply on the voltage supply line.

23 Claims, 6 Drawing Sheets

(56) References Cited

U.S. PATENT DOCUMENTS

| | | | |
|---|---|---|---|
| 8,666,688 B2 | 3/2014 | Spanier et al. | |
| 2008/0002323 A1* | 1/2008 | Huebl | H02H 9/046 361/79 |
| 2012/0050931 A1* | 3/2012 | Terry | H02H 9/04 361/91.5 |
| 2014/0077788 A1* | 3/2014 | Vemula | G05F 1/613 323/313 |
| 2015/0280415 A1 | 10/2015 | Welty | |

* cited by examiner

OVERVOLTAGE DETECTION CIRCUIT FOR DETECTING AN OVERVOLTAGE SPIKE FROM AN EXTERNAL POWER SUPPLY

BACKGROUND

Data storage devices, such as hard disk drives (HDDs), hybrid drives, and solid state drives (SSDs), may receive power from a host power supply, which can reside in a desktop or laptop computer or be a standalone power supply, for example. The host power supply typically receives its power from an AC power line. However, if voltage transients occur on the AC power line and the host power supply is not designed sufficiently well, the data storage device to which it is connected may be subjected to overvoltage spikes, which may cause errors, such as data write errors, or performance issues. For example, in an HDD, overvoltage spikes of sufficient amplitude might trigger shock sensors, thereby hurting read and write performance of the drive.

If data storage devices are subject to overvoltage spikes from external power supplies, it is desirable to detect and record the occurrence of the overvoltage spikes in the data storage device. This may allow a failure analysis engineer at a device manufacturer to determine if the recorded overvoltage spikes may be the cause of device failure if a customer's failed device is returned to the manufacturer.

BRIEF DESCRIPTION OF THE DRAWINGS

Overvoltage detection circuits and data storage devices that embody the various features of the invention will now be described with reference to the following drawings, in which.

DETAILED DESCRIPTION

Figure 1:
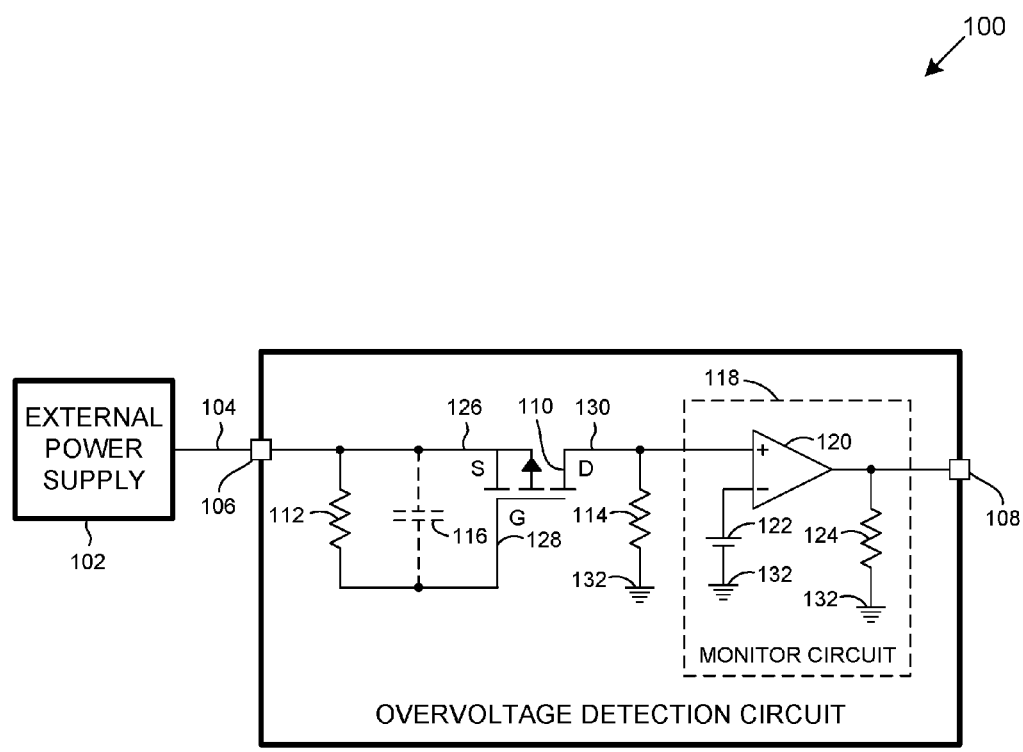
FIG. 1 is a diagram of an overvoltage detection circuit coupled to an external power supply, in accordance with one embodiment of the invention.

Various embodiments of the invention are directed to providing an overvoltage detection circuit configured to detect an overvoltage spike on a voltage supply line from an external power supply, and provide notification of the overvoltage spike detection. In various embodiments of the invention, a data storage device (e.g., an HDD, a hybrid drive, or an SSD) comprises an overvoltage detection circuit configured to detect an overvoltage spike on a voltage supply line from an external power supply coupled to the data storage device. In certain embodiments, a data storage device may be coupled to an external power supply by two voltage supply lines and comprise two overvoltage detection circuits, where each overvoltage detection circuit is configured to detect an overvoltage spike originating from the external power supply on one of the voltage supply lines. For example, one of the voltage supply lines may provide a low voltage (e.g., 5V) and the other voltage supply line may provide a high voltage (e.g., 12V) to the data storage device.

In various embodiments, the overvoltage detection circuit comprises a transistor configured to receive an overvoltage spike from the external power supply on the source terminal of the transistor via a voltage supply line, and provide an output voltage on the transistor's drain terminal to indicate detection of the overvoltage spike when it has a duration less than a time constant (based on at least one resistor and a parasitic capacitor each coupled between source and gate terminals of the transistor) and an amplitude that exceeds the threshold voltage of the transistor.

In certain embodiments of the invention, the time constant that determines the duration of an overvoltage spike that is detectable by the transistor may be adjustable by selectively coupling one or more resistors between the source and gate terminals of the transistor. For example, one or more register bits in a status register may be selectively set to switchably couple one or more associated resistors between the source and gate terminals of the transistor to adjust the time constant. For example, in an embodiment in which the overvoltage detection circuit resides in a data storage device, the register bits in the status register may be set by a controller (e.g., a hard disk controller or a memory controller).

In one embodiment of the invention, a data storage device is coupled to an external power supply and comprises an overvoltage detection circuit coupled to a controller, and the controller is coupled to NVM comprising a counter, wherein, when the overvoltage detection circuit detects an overvoltage spike from the external power supply, the overvoltage detection circuit notifies the controller via a interrupt signal, and the controller records the occurrence of the detected overvoltage spike by incrementing the counter in the NVM. For example, the counter may be a log counter.

In one embodiment, a data storage device is coupled to an external power supply and comprises an overvoltage detection circuit coupled to control circuitry and a controller coupled to the control circuitry and coupled to NVM comprising a counter, and a status register. When the overvoltage detection circuit detects an overvoltage spike from the external power supply, the overvoltage detection circuit notifies the control circuitry, the control circuitry sets a register bit in the status register to indicate detection of an overvoltage spike, and sends an interrupt signal to the controller to cause the controller to detect the set register bit in the status register, and increment the counter in the NVM to record the occurrence of the detected overvoltage spike.

In various embodiments of the invention, a data storage device is coupled to an external power supply by first and second voltage supply lines and comprises first and second overvoltage detection circuits, a controller, and NVM comprising first and second counters, wherein the first and second overvoltage detection circuits are coupled to respective first and second voltage supply lines. When the first overvoltage detection circuits detects an overvoltage spike on the first voltage supply line, the controller is notified and increments the first counter to record the occurrence of the detected overvoltage spike on the first voltage supply line, and when the second overvoltage detection circuit detects an overvoltage spike on the second voltage supply line, the controller is notified and increments the second counter to record the occurrence of the detected overvoltage spike on the second voltage supply line.

Various embodiments of the invention will now be described. These embodiments are presented by way of example only, and are not intended to limit the scope of the invention. Various omissions, substitutions and changes in the form of the methods and devices described herein may be made without departing from the spirit of the invention. To illustrate some of the embodiments, reference will now be made to the figures.

FIG. 1 shows overvoltage detection circuit 100 coupled external power supply 102 via voltage supply line 104, in accordance with one embodiment of the invention. As shown in FIG. 1, overvoltage detection circuit 100 comprises input port 106 for receiving a supply voltage from external power supply 102 via voltage supply line 104, and output port 108 for providing notification of a detected overvoltage spike via a digital signal. In one embodiment, external power supply 102 may be a host power supply residing in a computing device, such as a desktop, laptop or tablet computer or be a standalone power supply. For example, the supply voltage received from external power supply 102 may be a low supply voltage (e.g., 5V or lower) or a high supply voltage (e.g., 12V). Overvoltage detection circuit 100 may be utilized in a data storage device (e.g., an HDD, hybrid drive, or SSD) to detect and provide notification of the detected overvoltage spike. However, overvoltage detection circuit 100 may also be utilized for detection and notification of the detected overvoltage spike in different types of devices (e.g., electronic devices) where overvoltage spike detection and notification is desired.

As shown in FIG. 1, overvoltage detection circuit 100 further comprises transistor 110, resistors 112 and 114, parasitic capacitor 116, and monitor circuit 118. In the embodiment shown in FIG. 1, monitor circuit 118 comprises comparator 120, reference voltage 122, and resistor 124. As shown in FIG. 1, source terminal 126 of transistor 110 is coupled to input port 106 of overvoltage detection circuit 100, resistor 112 and parasitic capacitor 116 are both coupled between source and gate terminals 126, 128 of transistor 110 in a parallel configuration, and resistor 114 is coupled between drain terminal 130 of transistor 110 and ground 132. Transistor 110 may comprise a field effect transistor (FET) (e.g., a PMOS transistor). In one embodiment, the size of transistor 110 is selected based on the level of the supply voltage provided by external power supply 102 on voltage supply line 104. For example, the size of transistor 110 may be larger for a higher supply voltage (e.g., 12V) than for a lower supply voltage (e.g., 5V). In one embodiment, the transistor 110 may comprise a FET having a lower threshold voltage (Vth) for a lower supply voltage (e.g., 5V) and a FET having a higher Vth for a higher supply voltage (e.g., 12V).

In the embodiment shown in FIG. 1, parasitic capacitor 116 represents the capacitance that forms between the source terminal 126 and the gate terminal 128 of transistor 110, and may vary depending on the size of transistor 110. In the embodiment shown in FIG. 1, transistor 110 is configured to receive an overvoltage spike from external power supply 102 on source terminal 126 of transistor 110 via voltage supply line 104, and provide an output voltage on drain terminal 130 of transistor 110 to indicate detection of the overvoltage spike when it has a duration less than a time constant based on resistor 112 and parasitic capacitor 116 and an amplitude that exceeds the Vth of transistor 110. For the RC circuit comprising resistor 112 and parasitic capacitor 116, the time constant $\tau_1$ (in seconds) is:

$$\tau_1 = R_1 C_1 \qquad \text{(equation 1)}$$

where $R_1$ is the resistance (in ohms) of resistor 112 and $C_1$ is the capacitance (in farads) of parasitic capacitor 116. To detect an overvoltage spike on source terminal 126 of transistor 110, the overvoltage spike needs to momentarily turn on transistor 110, which occurs when the overvoltage spike has an amplitude that exceeds the Vth of transistor 110 and has a speed faster than (or a duration less than) time constant $\tau_1$ (the time constant formed by resistor 112 and parasitic capacitor 116).

In the embodiment shown in FIG. 1, the Vth and the capacitance of parasitic capacitor 116 are determined by the particular FET that is selected to implement transistor 110. Once the capacitance of parasitic capacitor 116 has been determined by the particular FET that has been selected, the resistance of resistor 112 determines the time constant $\tau_1$ and, consequently, the minimum speed (or duration) an overvoltage spike arriving on source terminal 126 of transistor 110 needs to have to be detected. In one embodiment, resistor 112 may have an adjustable resistance. In one embodiment, resistor 112 may be replaced with a plurality of resistors, one or more of which may be switchably coupled between source and gate terminals 126, 128 of transistor 110 to determine the minimum speed (or duration) that an overvoltage spike needs to have to be detected by transistor 110.

In the embodiment shown in FIG. 1, drain terminal 130 of transistor 110, which functions as the output of transistor 110, is coupled to the positive input of comparator 120, reference voltage 122 is coupled between the negative input of comparator 120 and ground 132, the output of comparator 120 is coupled to output port 108 of overvoltage detection circuit 100, and resistor 124 is coupled between the output of comparator 120 and ground 132. In the embodiment in FIG. 1, reference voltage 122 is selected to be less than the Vth of transistor 110, resistor 114 is selected to prevent comparator 120 from chattering and falsely triggering comparator 120, and resistor 124 is selected to provide a desired impedance (e.g., a high impedance) at the output of comparator 120.

In the embodiment shown in FIG. 1, comparator 120 is configured to monitor the output of transistor 110 at its drain terminal 130, and when an output voltage is provided at the output of transistor 110 and coupled to the positive input of comparator 120, comparator 120 outputs a digital signal (e.g., a logic "1") that is coupled to output port 108 of overvoltage detection circuit 100 to provide notification of detection of an overvoltage spike from external power supply 102 having an amplitude greater than the Vth of transistor 110 and a duration less the $\tau_1$ (the time constant formed by the resistance of resistor 112 and the capacitance of parasitic capacitor 116). In other embodiments, monitor circuit 118 may comprise an analog-to-digital converter (ADC) or other suitable circuit configured to convert an analog output of transistor 110 to a digital signal to provide notification of a detected overvoltage spike.

Figure 2:
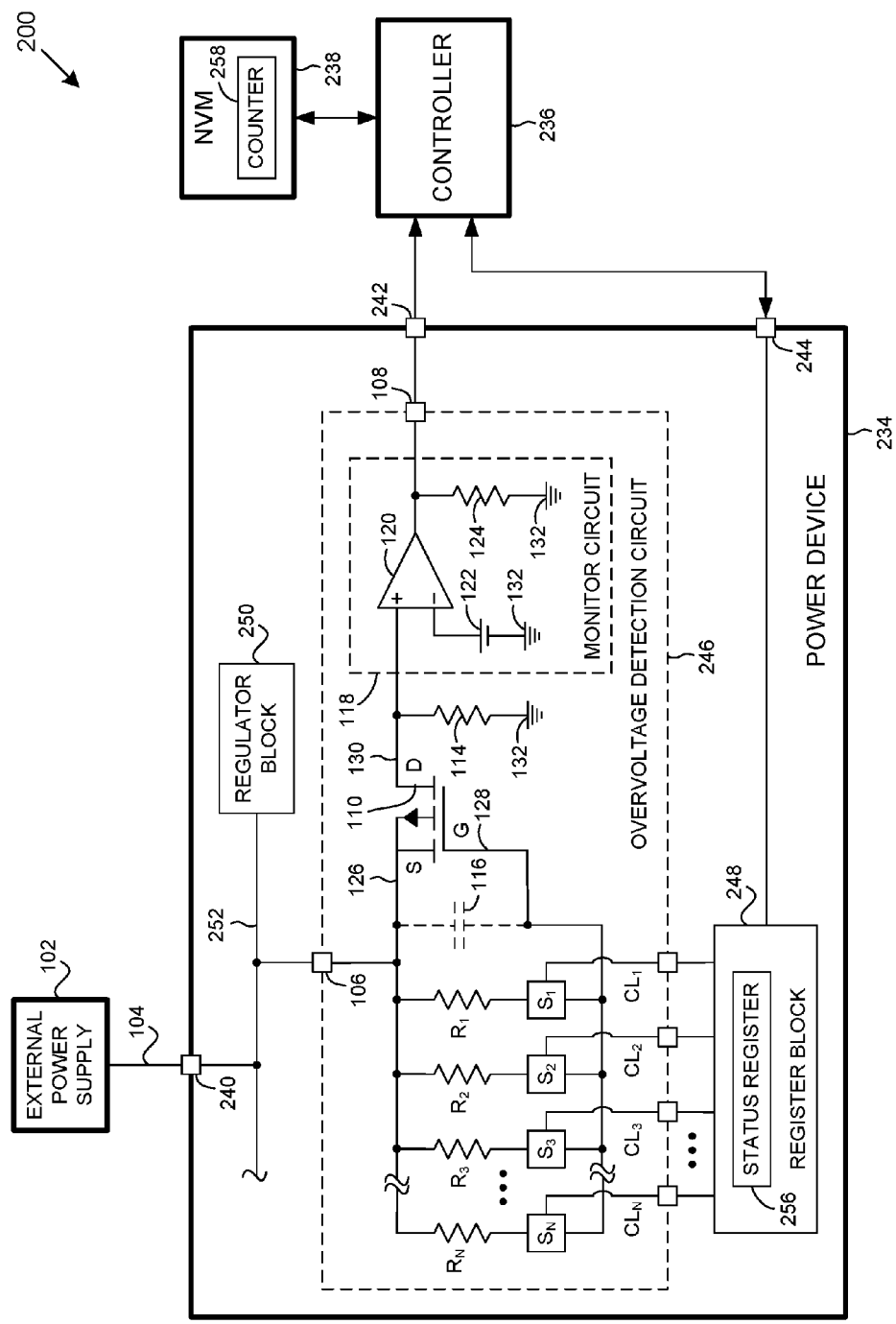
FIG. 2 is block diagram of a data storage device coupled to an external power supply and comprising a controller, non-volatile memory (NVM), and a power device comprising an overvoltage detection circuit, in accordance with one embodiment of the invention.

FIG. 2 shows data storage device 200 coupled external power supply 102 and comprising an overvoltage detection circuit, in accordance with one embodiment of the invention. As shown in the embodiment in FIG. 2, data storage device 200 (e.g., an HDD, hybrid drive, or SSD) comprises power device 234, controller 236, and non-volatile memory (NVM) 238. In the embodiment shown in FIG. 2, power device 234 comprises voltage input (VIN) port 240 for receiving a supply voltage from external power supply 102 via voltage supply line 104, output port 242 for notifying controller 236 of a detected overvoltage spike from external power supply 102, I/O port 244 for communicating with controller 236, overvoltage detection circuit 246 for detecting and providing notification of the detected overvoltage spike, register block 248, and regulator block 250. For example, the supply voltage provided by the external power supply 102 via voltage supply line 104 may be 5V for an embodiment in which the data storage device 200 is a disk drive, or 3.3V or 5V for an embodiment in which the data storage device 200 is an SSD. For example, power device 234 may be a Power Large Scale Integration (PLSI) or a power Application Specific Integrated Circuit (ASIC). To avoid duplicate description and preserve brevity, only the differences between overvoltage detection circuit 246 in FIG. 2 and overvoltage detection circuit 100 in FIG. 1 will be described herein.

As shown in the embodiment in FIG. 2, regulator block 250 is coupled to VIN port 240 via supply voltage rail 252 and provides one or more regulated voltages to power components of data storage device 200, such as NVM 238 and controller 236. As shown in FIG. 2, input port 106 of overvoltage detection circuit 246 is coupled to VIN port 240 of power device 234 via supply voltage rail 252 and output port 108 of overvoltage detection circuit 246 is coupled to output port 242 of power device 234. In overvoltage detection circuit 246, a plurality of resistors $R_1$-$R_N$ are each coupled between source terminal 126 and gate terminal 128 of transistor 110, switches $S_1$-$S_N$ are each coupled between a corresponding one of resistors $R_1$-$R_N$ and gate terminal 128 of transistor 110, and control lines $CL_1$-$CL_N$ are each coupled from register block 248 to a corresponding control terminal of one of switches $S_1$-$S_N$. In the embodiment shown in FIG. 2, control lines $CL_1$-$CL_N$ are digital control lines. In the embodiment in FIG. 2, each of switches $S_1$-$S_N$ is configured to couple a corresponding one of resistors $R_1$-$R_N$ in parallel with parasitic capacitor 116 between source and gate terminals 126, 128 of transistor 110 when activated by a corresponding one of control lines $CL_1$-$CL_N$. For example, switch $S_2$ is configured to couple resistor $R_2$ between source and gate terminals 126, 128 of transistor 110 when activated by control line $CL_2$. Each of switches $S_1$-$S_N$ may comprise, for example, a transistor (e.g., a FET) or a combination of transistors (e.g., FETs) that is configured to be in an ON state (closed state) when activated by a corresponding control line. In one embodiment, a single resistor is coupled between source and gate terminals 126, 128 of transistor 110 in place of resistors $R_1$-$R_N$ and switches $S_1$-$S_N$, as shown in the embodiment in FIG. 1.

In the embodiment shown in FIG. 2, for the RC circuit comprising resistor $R_i$, where $R_i$ is one of resistors $R_1$-$R_N$ that is coupled between source and gate terminals 126, 128 of transistor 110 when corresponding switch $S_i$ is activated, and parasitic capacitor 116, time constant $\tau_2$ (in seconds) is:

$$\tau_2 = R_2 C_2 \quad \text{(equation 2)}$$

where $R_2$ is the resistance (in ohms) of resistor $R_i$ and $C_2$ is the capacitance (in farads) of parasitic capacitor 116. For example, if two or more of resistors $R_1$-$R_N$ are selected to be coupled between source and gate terminals 126, 128 of transistor 110 by activating two or more of corresponding switches $S_1$-$S_N$, $R_2$ in equation 2 would be equal to the total resistance of the parallel combination of the two or more resistors. In the embodiment shown in FIG. 2, the resistance of each of resistors $R_1$-$R_N$ may be selected to achieve a desired range for time constant $\tau_2$.

In the embodiment shown in FIG. 2, to detect an overvoltage spike arriving at source terminal 126 of transistor 110 from external power supply 102, the overvoltage spike needs to momentarily turn on transistor 110, which occurs when the overvoltage spike has an amplitude that exceeds the Vth of transistor 110 and is faster than (or has a duration less than) time constant $\tau_2$ (the time constant formed by at least one of resistors $R_1$-$R_N$ and parasitic capacitor 116). In the embodiment shown in FIG. 2, the speed of an overvoltage spike that may be detected by transistor 110 may be adjusted by changing time constant $\tau_2$, which may be accomplished changing resistance $R_2$ in time constant $\tau_2$ by appropriately selecting one or more of resistors $R_1$-$R_N$ to couple between source and gate terminals 126, 128 of transistor 110.

In the embodiment shown in FIG. 2, register block 248 is coupled to the control terminals of switches $S_1$-$S_N$ via respective control lines $CL_1$-$CL_N$ and is coupled to I/O port 244 of power device 234. In the embodiment in FIG. 2, register block 248 comprises at least one status register 256, which may comprise a plurality of addressable register bits associated with respective control lines $CL_1$-$CL_N$. Each register bit may be programmed with a logic value (a "1" or "0"), which is applied to an associated control line to control whether a switch coupled to that control line is in an OFF or ON state. For example, the register bit in the status register 256 associated with control line $CL_1$ may be programmed with a logic value "1" to cause control line $CL_1$ to set corresponding switch $S_1$ to an ON state, or may be programmed with a logic value "0" to cause control line $CL_1$ to set switch $S_1$ to an OFF state. In the embodiment shown in FIG. 2, status register 256 may be a serial register.

As shown in the embodiment in FIG. 2, controller 236 is coupled to output port 242 and I/O port 244 of power device 234 and coupled to NVM 238. In an embodiment in which data storage device 200 is an HDD, controller 236 may be a hard disk controller, and in an embodiment in which data storage device 200 is an SSD, controller 236 may be a solid state memory controller (e.g., a NAND controller). In an embodiment in which data storage device 200 is an HDD, controller 236 may be situated in a System-On-a-Chip (SOC). In the embodiment shown in FIG. 2, I/O port 244 may be a serial port. As shown in FIG. 2, NVM 238 comprises counter 258, which may be, for example, a log counter, such as a drive reliability monitor (DRM) log counter.

In an embodiment in which data storage device 200 is an HDD, NVM 238 may comprise rotating magnetic media (e.g., one or more disks), and in an embodiment in which the data storage device 200 is an SSD, the controller 236 may comprise solid state memory (e.g., flash memory or other type of non-volatile semiconductor memory). In other embodiments, NVM 238 may comprise, for example, Magnetoresistive RAM (MRAM), Chalcogenide RAM (C-RAM), correlated electron RAM (CeRAM), Phase Change Memory (PC-RAM or PRAM), Programmable Metallization Cell RAM (PMC-RAM or PMCm), Ovonic Unified Memory (OUM), Resistance RAM (ReRAM), NAND memory, NOR memory, EEPROM, Ferroelectric Memory (FeRAM), or other discrete NVM (non-volatile memory) chips.

In the embodiment shown in FIG. 2, when overvoltage detection circuit 246 detects an overvoltage spike from external power supply 102 on voltage supply line 104, overvoltage detection circuit 246 is configured to provide a notification of the detected overvoltage spike at output port 108 via an interrupt signal, which is coupled to output port 242 of power device 234. In the embodiment in FIG. 2, when controller 236 receives the interrupt signal from output port 242 providing notification of the detected overvoltage spike, controller 236 is configured to increment counter 258 in NVM 238 to record the occurrence of the detected overvoltage spike from external power supply 102.

In the embodiment shown in FIG. 2, controller 236 is further configured to program the register bits in status register 256 in register block 248 associated with control lines $CL_1$-$CL_N$ to control the state (i.e., ON or OFF state) of each of switches $S_1$-$S_N$ and, consequently, which one or more of resistors $R_1$-$R_N$ is coupled between source and gate terminals 126, 128 of transistor 110. By controlling which one or more of resistors $R_1$-$R_N$ is coupled between source and gate terminals 126, 128 of transistor 110, controller 236 may determine the value of time constant $\tau_2$ and, consequently, the speed (or duration) of an overvoltage spike from external power supply 102 that may be detected by transistor 110.

Figure 3:
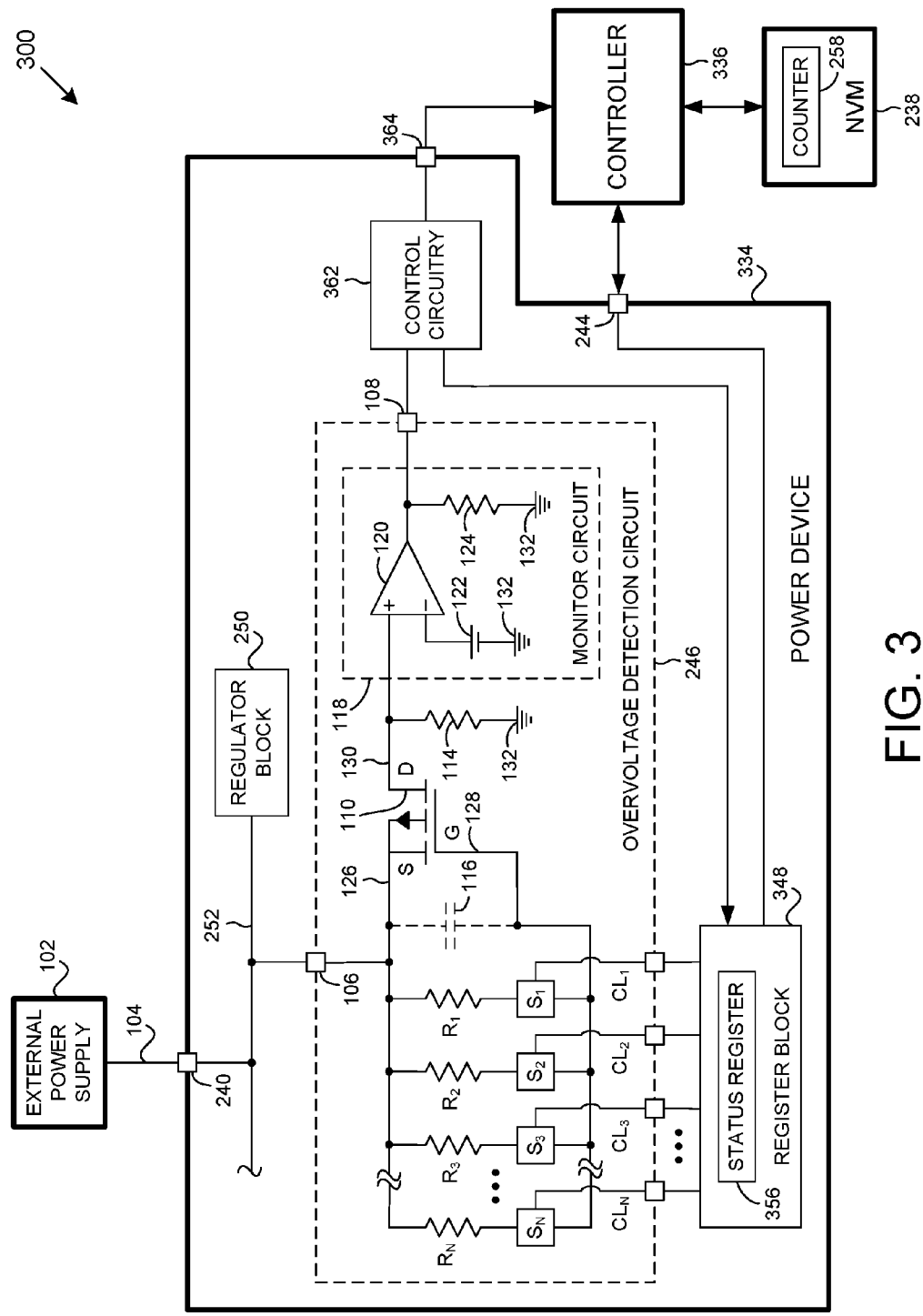
FIG. 3 is block diagram of a data storage device coupled to an external power supply and comprising a controller, NVM, and a power device comprising an overvoltage detection circuit, in accordance with one embodiment of the invention.

FIG. 3 shows data storage device 300 coupled to external power supply 102 and comprising an overvoltage detection circuit coupled to control circuitry, in accordance with one embodiment of the invention. To avoid duplicate description and preserve brevity, only the differences between data storage device 300 in FIG. 3 and data storage device 200 in FIG. 2 and overvoltage detection circuit 100 in FIG. 1, will be described herein. As shown in FIG. 3, data storage device 300 comprises power device 334, controller 336, and NVM 238, and the power device 334 comprises VIN port 240, I/O port 244, overvoltage detection circuit 246, regulator block 250, register block 348 (which comprises status register 356), control circuitry 362, and output port 364. In the embodiment shown in FIG. 3, status register 356 comprises a register bit that may be programmed to indicate that detection of an overvoltage spike by overvoltage detection circuit 246 in addition to comprising programmable register bits associated with control lines $CL_1$-$CL_N$.

As shown in FIG. 3, control circuitry 362 is coupled to output port 108 of overvoltage detection circuit 246, register block 348 and coupled to controller 336 via output port 364 of power device 334. In the embodiment in FIG. 3, control circuitry 362 may comprise, for example, a microprocessor or combinatory logic. In one embodiment, control circuitry 362 may comprise a state machine. In the embodiment in FIG. 3, when overvoltage detection circuit 246 detects an overvoltage spike from external power supply 102, control circuitry 362 is configured to receive notification of the detected overvoltage spike at output port 108 of overvoltage detection circuit 246, program the appropriate register bit in status register 356 in the register block 348 to indicate detection of an overvoltage spike by overvoltage detection circuit 246, and send an interrupt signal to controller 336 via output port 364 of power device 334 notifying controller 336 that a change has occurred in one of the register bits in status register 356.

In the embodiment shown in FIG. 3, the status register 356 may comprise a plurality of addressable register bits, each of which may be programmed to indicate an occurrence of a different event affecting data storage device 300, such as a shock event or detection of an overvoltage spike from external power supply 102. The interrupt signal sent by control circuitry 362 to controller 336 in the embodiment in FIG. 3 does not indicate the specific event that has occurred—only that an event has occurred as indicated by a register bit at one of the addresses in status register 356 associated with event occurrences.

In the embodiment shown in FIG. 3, controller 336 is configured to receive the interrupt signal from control circuitry 362 via output port 364 indicating that one of the register bits in the status register 356 has been programmed to indicate an occurrence of the event associated with that register bit. The controller 336 is further configured to check the register bits associated with event occurrences via the I/O port 244, determine that a register bit has been programmed to indicate detection of an overvoltage spike from external power supply 102, and record the occurrence of the detected overvoltage spike in NVM 238 by incrementing counter 258. In one embodiment, controller 336 resets the register bit so that it can be programmed again by control circuitry 362 to indicate when another overvoltage spike is detected by overvoltage detection circuit 246. In the embodiment shown in FIG. 3, controller 336 is further configured to program register bits in status register 356 in register block 348 associated with control lines $CL_1$-$CL_N$ to control the state (i.e., ON or OFF state) of each of switches $S_1$-$S_N$ and, consequently, which one or more of resistors $R_1$-$R_N$ is coupled between source and gate terminals 126, 128 of transistor 110 to determine a value of time constant $\tau_2$ in equation 2 as discussed above.

In one embodiment, controller 336 does not receive an interrupt signal from control circuitry 362 indicating that one of the register bits in status register 356 has been programmed to indicate an occurrence of the event associated with that register bit, but is configured to periodically poll the register bits in status register 356, and when it detects that a register bit has been programmed to indicate an occurrence of a detected overvoltage spike, record the occurrence of the detected overvoltage spike in NVM 238 by incrementing counter 258.

Figure 4:
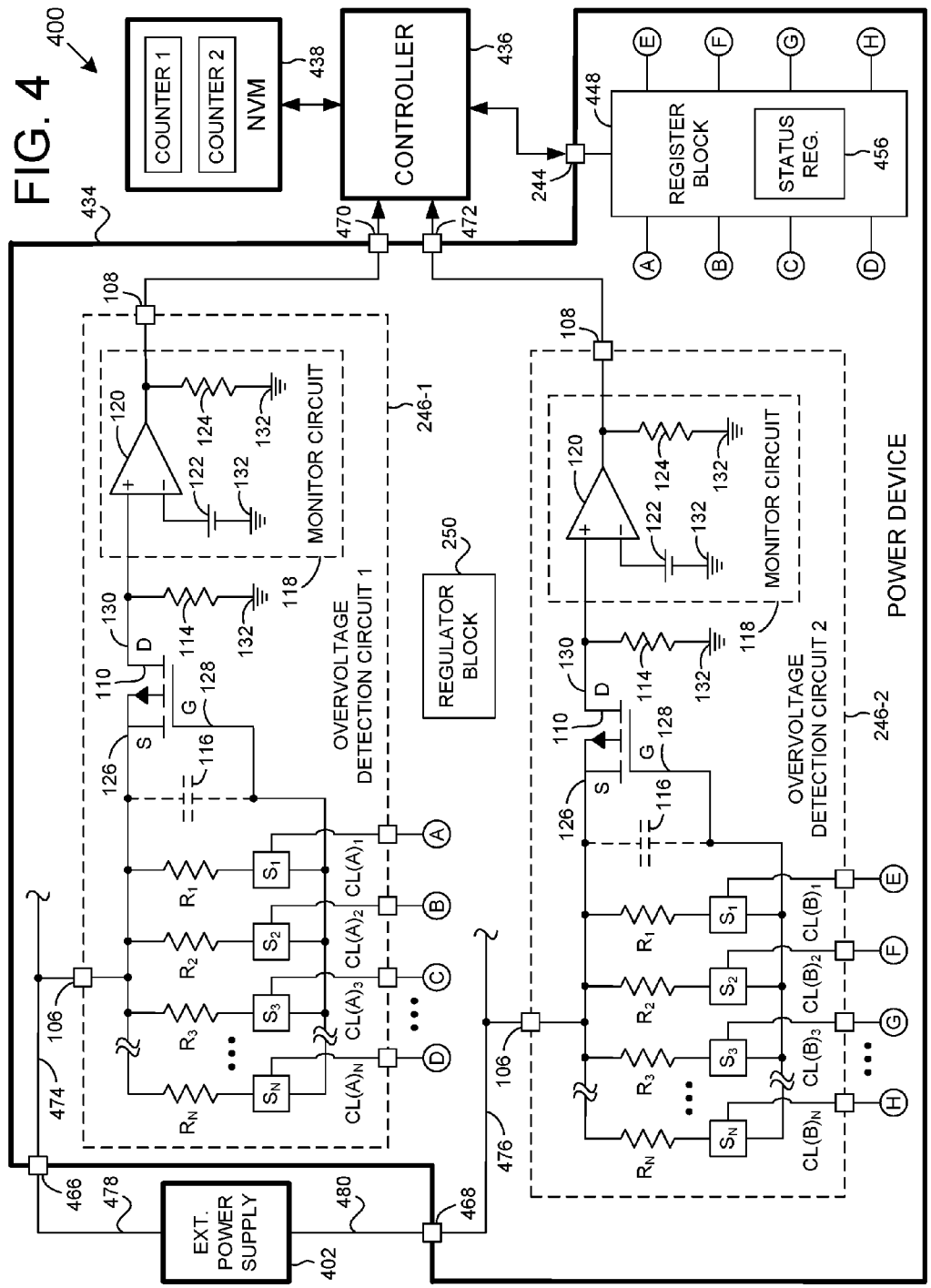
FIG. 4 is block diagram of a data storage device coupled to an external power supply and comprising a controller, NVM, and a power device comprising two overvoltage detection circuits coupled to different voltage supply lines of the external power supply, in accordance with one embodiment of the invention.

FIG. 4 shows data storage device 400 coupled to external power supply 402 and comprising two overvoltage detection circuits coupled to different respective voltage supply lines of external power supply 402, in accordance with one embodiment of the invention. To avoid duplicate description and preserve brevity, only the differences between data storage device 400 in FIG. 4 and data storage devices 200 and 300 in FIGS. 2 and 3, and overvoltage detection circuit 100 in FIG. 1, will be described herein. As shown in FIG. 4, data storage device 400 comprises power device 434, controller 436, and NVM 438, and power device 434 comprises VIN ports 466 and 468, overvoltage detection circuits 246-1 and 246-2, I/O port 244, regulator block 250, register block 448 (which comprises status register 456), output ports 470 and 472, and supply voltage rails 474 and 476.

In the embodiment shown in FIG. 4, external power supply 402 provides a first voltage (e.g., a low voltage) to VIN port 466 of power device 434 via voltage supply line 478 and a second voltage (e.g., a high voltage) to VIN port 468 of power device 434 via voltage supply line 480. For example, the first voltage may be 5V and the second voltage may be 12V. As shown in FIG. 4, input port 106 of overvoltage detection circuit 246-1 is coupled to voltage supply line 478 via supply voltage rail 474, output port 108 of overvoltage detection circuit 246-1 is coupled to output port 470 of power device 434, input port 106 of overvoltage detection circuit 246-2 is coupled to voltage supply line 480 via supply voltage rail 476, and output port 108 of overvoltage detection circuit 246-2 is coupled to output port 472 of power device 434. In the embodiment shown in FIG. 4, controller 436 is coupled to output ports 470 and 472 and I/O port 244 of power device 434 and NVM 438, which comprises counters 1 & 2. For example, counters 1 & 2 may each be a log counter, such as a DRM log counter.

As shown in the embodiment in FIG. 4, register block 448 is coupled to control terminals of switches $S_1$-$S_N$ in overvoltage detection circuit 246-1 via respective control lines $CL(A)_1$-$CL(A)_N$, control terminals of switches $S_1$-$S_N$ in overvoltage detection circuit 246-2 via respective control lines $CL(B)_1$-$CL(B)_N$, and I/O port 244 of power device 434. In the embodiment in FIG. 4, register block 448 comprises at least one status register 456, which may comprise a plurality of addressable register bits associated with respective control lines $CL(A)_1$-$CL(A)_N$ and $CL(B)_1$-$CL(B)_N$. Each register bit may be programmed with a logic "1" or "0", which is applied to an associated control line to control whether a corresponding switch in overvoltage detection circuit 246-1 or 246-2 is in an OFF or ON state. In the embodiment in FIG. 4, controller 436 is configured to program the register bits in status register 456 associated with control lines $CL(A)_1$-$CL(A)_N$ and $CL(B)_1$-$CL(B)_N$ to control the state (i.e., ON or OFF state) of each of switches $S_1$-$S_N$ in overvoltage detection circuit 246-1 and switches $S_1$-$S_N$ in overvoltage detection circuit 246-2.

In the embodiment of FIG. 4, during operation of data storage device 400, if an overvoltage spike is detected from external power supply 402 on voltage supply line 478 by overvoltage detection circuit 246-1, an interrupt signal is sent to controller 436 via output port 108 of overvoltage detection circuit 246-1 and output port 470 of power device 434 notifying controller 436 of the detected overvoltage spike. Similarly, if an overvoltage spike is detected from external power supply 402 on voltage supply line 480 by overvoltage detection circuit 246-2, an interrupt signal is sent to controller 436 via output port 108 of overvoltage detection circuit 246-2 and output port 472 of power device 434. In the embodiment in FIG. 4, if controller 436 receives notification of a detected overvoltage spike via an interrupt signal from output port 470 of power device 434, controller 436 is configured to record the occurrence of the detected overvoltage spike from external power supply 402 on voltage supply line 478 in NVM 438 by incrementing counter 1. Similarly, if an interrupt signal is received by controller 436 via output port 472, controller 436 is configured to record an occurrence of a detected overvoltage spike from external power supply 402 on voltage supply line 480 by overvoltage detection circuit 246-2 by incrementing counter 2 in NVM 438.

Figure 5:
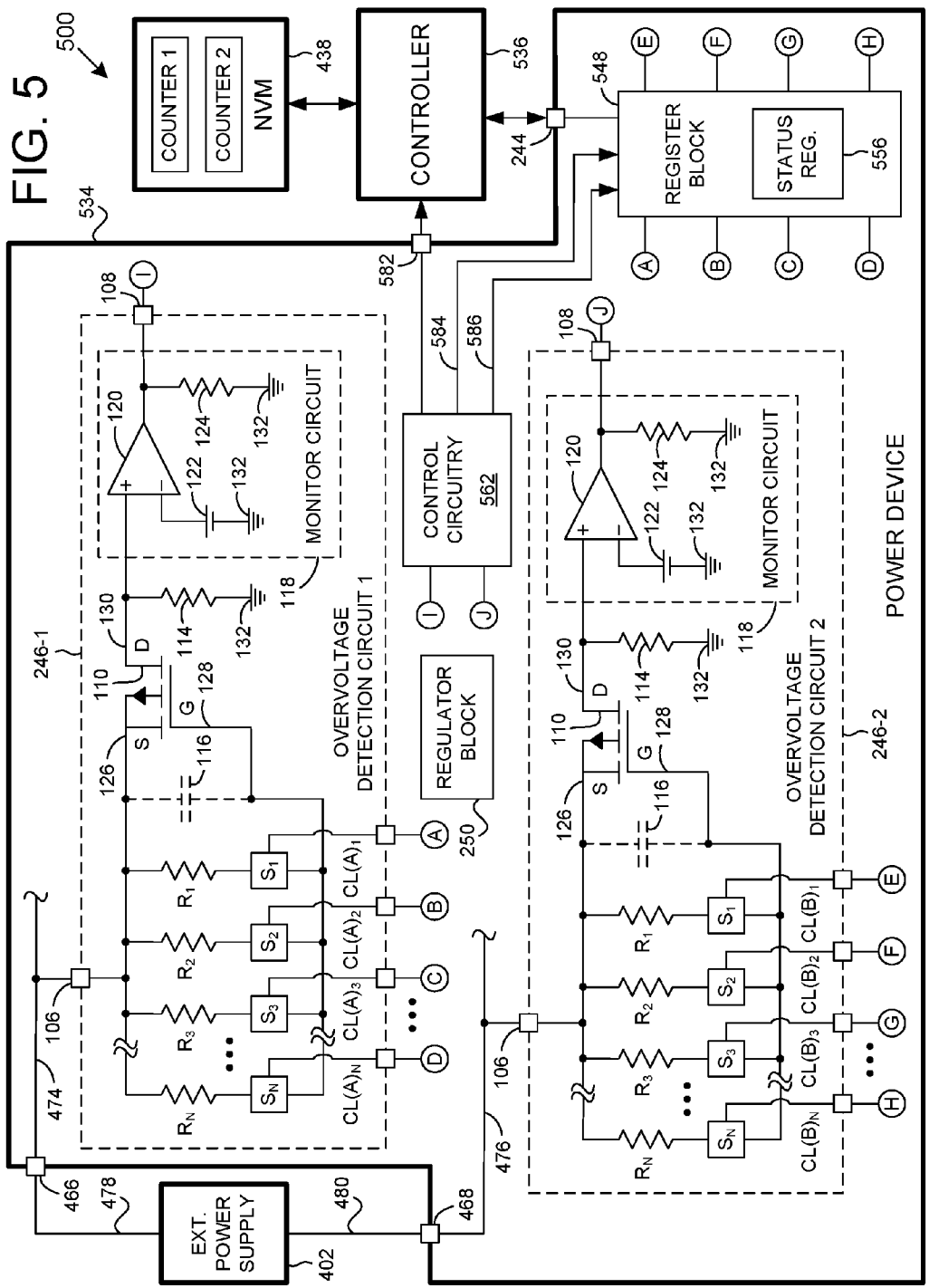
FIG. 5 is block diagram of a data storage device coupled to an external power supply and comprising a controller, NVM, and a power device comprising two overvoltage detection circuits to different voltage supply lines of the external power supply, in accordance with one embodiment of the invention.

FIG. 5 shows data storage device 500 coupled to an external power supply 402 and comprising two overvoltage detection circuits coupled to different respective voltage supply lines of external power supply 402, in accordance with one embodiment of the invention. To avoid duplicate description and preserve brevity, only the differences between data storage device 500 in FIG. 5 and data storage devices 200, 300, and 400 in FIGS. 2, 3, and 4 and overvoltage detection circuit 100 in FIG. 1, will be described herein. As shown in FIG. 5, data storage device 500 comprises power device 534, controller 536, and NVM 438, and power device 534 comprises VIN ports 466 and 468, overvoltage detection circuits 246-1 and 246-2, I/O port 244, regulator block 250, register block 548 (which comprises status register 556), control circuitry 562, output port 582, and supply voltage rails 474 and 476.

In the embodiment shown in FIG. 5, control circuitry 562 is coupled to output ports 108 of overvoltage detection circuits 246-1 and 246-2, output port 582 of power device 534, and status register 556 in register block 548 via control lines 584 and 586. In the embodiment shown in FIG. 5, status register 556 may comprise an addressable register bit (register bit 1) that may be programmed to indicate detection by overvoltage detection circuit 246-1 of an overvoltage spike from external power supply 402 on voltage supply line 478, and another addressable register bit (register bit 2) that may be programmed to indicate detection by overvoltage detection circuit 246-2 of an overvoltage spike from external power supply 402 on voltage supply line 480. In the embodiment in FIG. 5, control circuitry 562 is configured to program register bit 1 if it receives notification from overvoltage detection circuit 246-1 that an overvoltage spike has been detected on voltage supply line 478, or program register bit 2 if it receives notification from overvoltage detection circuit 246-2 of detection of an overvoltage spike on voltage supply line 480. In the embodiment shown in FIG. 5, if control circuitry 562 programs register bit 1 or 2 to indicate detection of an overvoltage spike on respective voltage supply lines 478 or 480, control circuitry 562 is configured to send an interrupt signal to controller 536 via output port 582 of power device 534.

In the embodiment shown in FIG. 5, when controller 536 receives an interrupt signal from control circuitry 562 via output port 582 indicating that a register bit in status register 556 has been programmed to indicate detection of an overvoltage spike from external power supply 402 on voltage supply line 478 or 480, controller 536 is configured to scan the register bits in status register 556 via I/O port 244 to determine which register bit has been programmed. If controller 536 determines that register bit 1 has been set, controller 536 is configured to increment counter 1 in NVM 438 to record the occurrence of a detected overvoltage spike on voltage supply line 478 by overvoltage detection circuit 246-1, or if controller 536 determines that register bit 2 has been programmed, controller 536 is configured to increment counter 2 in NVM 438 to record the occurrence of a detected overvoltage spike on voltage supply line 480 by overvoltage detection circuit 246-2. In the embodiment in FIG. 5, controller 536 is further configured to clear whichever register bit (i.e., register bit 1 or 2) has been programmed to enable that register bit to be programmed again when another overvoltage spike has been detected by the associated overvoltage detection circuit.

Figure 6:
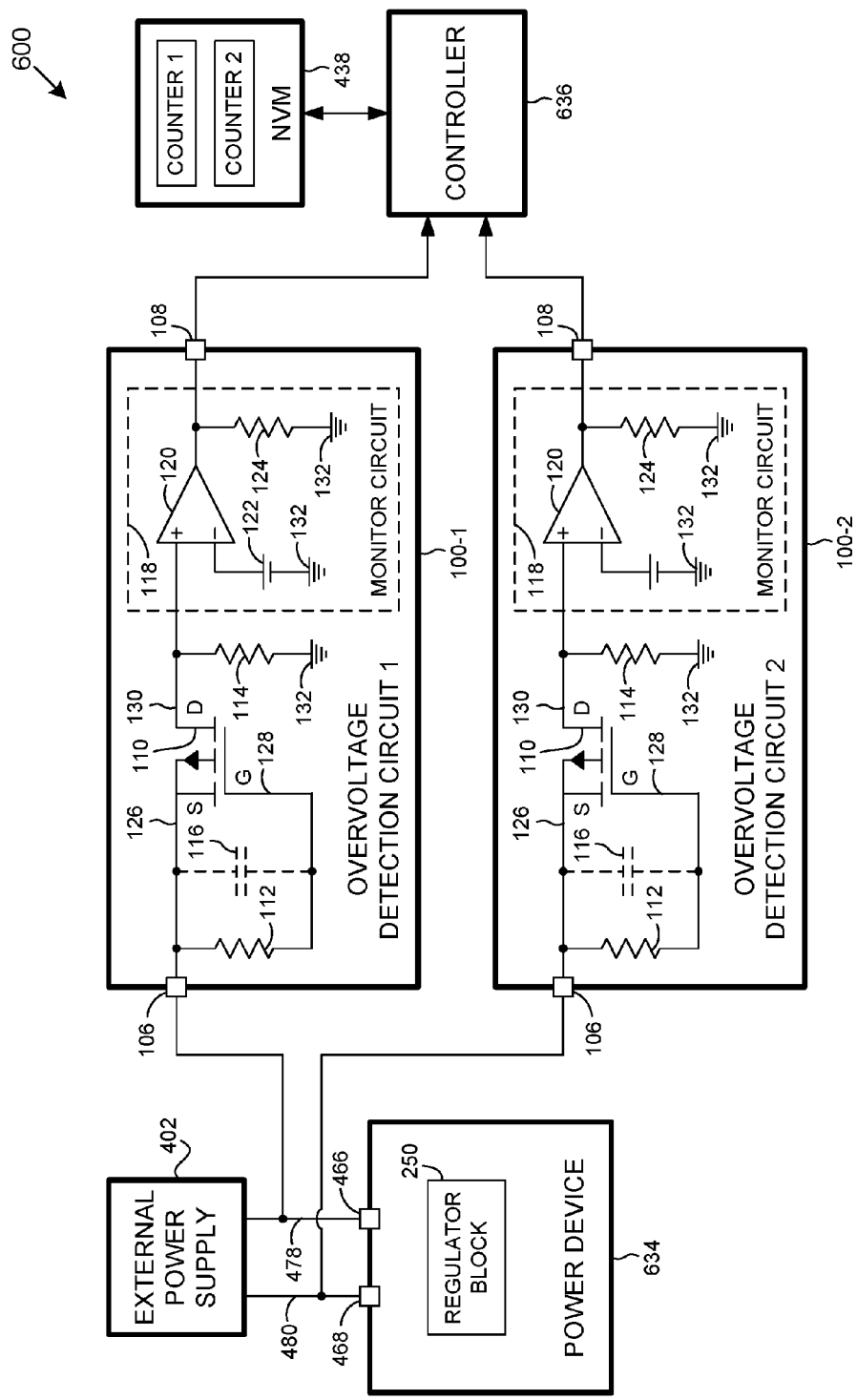
FIG. 6 is block diagram of a data storage device coupled to an external power supply and comprising a controller, NVM, a power device, and two overvoltage detection circuits to different voltage supply lines of the external power supply, in accordance with one embodiment of the invention.

FIG. 6 shows data storage device 600 coupled to external power supply 402 and comprising two overvoltage detection circuits coupled to difference voltage supply lines of external power supply 402, in accordance with one embodiment of the invention. To avoid duplicate description and preserve brevity, only the differences between data storage device 600 in FIG. 6 and data storage devices 200, 300, 400, and 500 in FIGS. 2, 3, 4, and 5 and overvoltage detection circuit 100 in FIG. 1, will be described herein. As shown in FIG. 6, data storage device 600 comprises power device 634, controller 636, NVM 438 (which comprises counters 1 and 2), and overvoltage detection circuits 100-1 and 100-2, and power device 634 comprises regulator block 250. In the embodiment shown in FIG. 6, input port 106 of overvoltage detection circuit 100-1 is coupled to voltage supply line 478, output port 108 of overvoltage detection circuit 100-1 is coupled to controller 636, input port 106 of overvoltage detection circuit 100-2 is coupled to voltage supply line 480, and output port 108 of overvoltage detection circuit 100-2 is coupled to controller 636.

In the embodiment shown in FIG. 6, when overvoltage detection circuit 100-1 detects an overvoltage spike from external power supply 402 on voltage supply line 478, it sends an interrupt signal to controller 636 via output port 108 of overvoltage detection circuit 100-1 to provide notification of the detected overvoltage spike, and when overvoltage detection circuit 100-2 detects an overvoltage spike on voltage supply line 480, it sends an interrupt signal to controller 636 via output port 108 of overvoltage detection circuit 100-2 providing notification of the detected overvoltage spike. In the embodiment in FIG. 6, when controller 636 receives an interrupt signal from overvoltage detection circuit 100-1, controller 636 increments counter 1 in NVM 438 to record the occurrence of the detected overvoltage spike on voltage supply line 478. Similarly, when controller 636 receives an interrupt signal from overvoltage detection circuit 100-2, controller 636 increments counter 2 in NVM 438 to record the occurrence of the detected overvoltage spike on voltage supply line 480.

While some embodiments of the invention have been described, these embodiments have been presented by way of example only, and are not intended to limit the scope of the disclosure. Indeed, the novel circuits and devices described herein may be embodied in a variety of other forms. Furthermore, various omissions, substitutions and changes in the form of the circuits and devices described herein may be made without departing from the spirit of the disclosure. For example, the various components described may be implemented as software and/or firmware on a processor, ASIC/FPGA, or dedicated hardware. As an additional example, some of the above described overvoltage detection circuit embodiments may be implemented in electronic devices other than data storage devices.

Also, the features and attributes of the specific embodiments disclosed above may be combined in different ways to form additional embodiments, all of which fall within the scope of the present disclosure. Although the present disclosure provides certain preferred embodiments and applications, other embodiments that are apparent to those of ordinary skill in the art, including embodiments which do not provide all of the features and advantages set forth herein, are also within the scope of this disclosure. Accordingly, the scope of protection is defined only by the claims.

What is claimed is:

1. An overvoltage detection circuit coupled to an external power supply via a voltage supply line, the overvoltage detection circuit comprising:
   a transistor comprising a first terminal coupled to the voltage supply line, a second terminal coupled to the first terminal via a resistor, the second terminal coupled to a parasitic capacitor, the transistor configured to:
     receive an overvoltage spike from the external power supply on the first terminal of the transistor; and
     provide an output voltage on a third terminal of the transistor to indicate detection of the overvoltage spike when it has:
       a duration less than a time constant based on the resistor and the parasitic capacitor; and
       an amplitude that exceeds a threshold voltage of the transistor; and
   a monitor circuit configured to receive the output voltage from the transistor and provide a digital signal providing a notification of the detected overvoltage spike from the external power supply on the voltage supply line.

2. The overvoltage detection circuit as recited in claim 1, wherein the monitor circuit is coupled to a controller and the controller is coupled to non-volatile memory, the controller configured to receive the notification of the detected overvoltage spike and record the occurrence of the detected overvoltage spike in the non-volatile memory.

3. The overvoltage detection circuit as recited in claim 2, wherein recording the occurrence of the detected overvoltage spike comprises incrementing a counter in the non-volatile memory.

4. The overvoltage detection circuit as recited in claim 1, further comprising a plurality of selectable resistors coupled between the first and second terminals of the transistor, wherein the resistor is one of the selectable resistors that is selected to determine a duration of an overvoltage spike that is detectable by the transistor.

5. The overvoltage detection circuit as recited in claim 4, further comprising a plurality of switches, wherein each of the plurality of switches is coupled to one of the selectable resistors and is configured to select a corresponding selectable resistor when activated.

6. The overvoltage detection circuit as recited in claim 5, further comprising a register coupled to each of the plurality of switches and configured to select one of the plurality of selectable resistors by activating a corresponding switch.

7. The overvoltage detection circuit as recited in claim 2, wherein the controller is a hard disk controller.

8. The overvoltage detection circuit as recited in claim 2, wherein the controller is a solid state memory controller.

9. The overvoltage detection circuit as recited in claim 2, wherein the non-volatile memory comprises rotating magnetic media.

10. The overvoltage detection circuit as recited in claim 2, wherein the non-volatile memory comprises flash memory.

11. The overvoltage detection circuit as recited in claim 2, wherein the overvoltage detection circuit and the controller are situated in a data storage device.

12. The overvoltage detection circuit as recited in claim 11, wherein the data storage device is a hard disk drive.

13. The overvoltage detection circuit as recited in claim 11, wherein the data storage device is a solid state drive.

14. A data storage device coupled to an external power supply, the data storage device comprising:
   an overvoltage detection circuit coupled to the external power supply via a voltage supply line, the overvoltage detection circuit comprising:
     a transistor comprising a first terminal coupled to the voltage supply line, a second terminal coupled to the first terminal via a resistor, the second terminal coupled to a parasitic capacitor, the transistor configured to:
       receive an overvoltage spike on the first terminal of the transistor from the external power supply via the voltage supply line; and
       provide an output voltage on a third terminal of the transistor to indicate detection of the overvoltage spike when it has:
         a duration less than a time constant based on the resistor and the parasitic capacitor; and
         an amplitude that exceeds a threshold voltage of the transistor; and
     a monitor circuit configured to receive the output voltage from the transistor and provide a digital signal providing a notification of the detected overvoltage spike on the voltage supply line; and a controller coupled to non-volatile memory, the controller configured to receive the notification of the detected overvoltage spike on the voltage supply line and record its occurrence in the non-volatile memory.

15. The data storage device as recited in claim 14, wherein recording the occurrence of the detected overvoltage spike on the voltage supply line comprises incrementing a counter in the non-volatile memory.

16. The data storage device as recited in claim 14, wherein the overvoltage detection circuit further comprises a plurality of selectable resistors coupled between the first and second terminals of the transistor, wherein the resistor in the overvoltage detection circuit is one of the selectable resistors that is selected to determine a duration of an overvoltage spike on the voltage supply line that is detectable by the transistor.

17. The data storage device as recited in claim 16, wherein the overvoltage detection circuit further comprises a plurality of switches, wherein each of the plurality of switches is coupled to one of the selectable resistors and is configured to select a corresponding selectable resistor when activated.

18. The data storage device as recited in claim 17, further comprising a register coupled to each of the plurality of switches and configured to select one of the plurality of selectable resistors by activating a corresponding switch.

19. A data storage device coupled to an external power supply, the data storage device comprising:
first and second overvoltage detection circuits coupled to the external power supply via respective first and second voltage supply lines, each overvoltage detection circuit comprising:
a transistor comprising a first terminal coupled to the respective voltage supply line, a second terminal coupled to the first terminal via a resistor, the second terminal coupled to a parasitic capacitor, the transistor configured to:
receive an overvoltage spike on the first terminal of the transistor via the respective voltage supply line; and
provide an output voltage on a third terminal of the transistor to indicate detection of the overvoltage spike when it has:
a duration less than a time constant based on the resistor and the parasitic capacitor; and
an amplitude that exceeds a threshold voltage of the transistor; and
a monitor circuit configured to receive the output voltage from the transistor and provide a digital signal providing a notification of the detected overvoltage spike on the respective voltage supply line; and
a controller coupled to non-volatile memory, the controller configured to receive notification of the detected overvoltage spike on the respective voltage supply line and record its occurrence in the non-volatile memory.

20. The data storage device as recited in claim 19, wherein the first voltage supply line provides a first supply voltage and the second voltage supply line provides a second supply voltage that is different than the first supply voltage.

21. The data storage device as recited in claim 19, wherein the non-volatile memory comprises first and second counters, wherein recording the occurrence of the detected overvoltage spike on the first voltage supply line comprises incrementing the first counter and recording the occurrence of the detected overvoltage spike on the second voltage supply line comprises incrementing the second counter.

22. The data storage device as recited in claim 19, wherein each overvoltage detection circuit further comprises a plurality of selectable resistors coupled between the first and second terminals of the transistor, wherein the resistor in the respective overvoltage detection circuit is one of the selectable resistors that is selected to determine a duration of an overvoltage spike that is detectable by the transistor on the respective voltage supply line.

23. The data storage device as recited in claim 22, wherein each overvoltage detection circuit further comprises a plurality of switches, wherein each of the plurality of switches is coupled to one of the selectable resistors and is configured to select a corresponding selectable resistor when activated.

* * * * *